(12) United States Patent
Yamada

(10) Patent No.: US 9,915,698 B2
(45) Date of Patent: Mar. 13, 2018

(54) DEVICE OF CONTACTING SUBSTRATE WITH PROBE CARD AND SUBSTRATE INSPECTION APPARATUS HAVING SAME

(71) Applicant: Tokyo Electron Limited, Tokyo (JP)

(72) Inventor: Hiroshi Yamada, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 14/418,701

(22) PCT Filed: Jun. 18, 2013

(86) PCT No.: PCT/JP2013/067159
§ 371 (c)(1),
(2) Date: Jan. 30, 2015

(87) PCT Pub. No.: WO2014/021024
PCT Pub. Date: Feb. 6, 2014

(65) Prior Publication Data
US 2015/0177317 A1     Jun. 25, 2015

(30) Foreign Application Priority Data
Jul. 31, 2012    (JP) ................................ 2012-169512

(51) Int. Cl.
*G01R 31/28*     (2006.01)
(52) U.S. Cl.
CPC ..... *G01R 31/2887* (2013.01); *G01R 31/2893* (2013.01)
(58) Field of Classification Search
CPC ............ G01R 1/07307; G01R 31/2887; G01R 31/2893

(Continued)

(56) References Cited

U.S. PATENT DOCUMENTS 8,587,331 B2 * 11/2013 Berry ................. G01R 31/2891
324/750.16
2002/0057423 A1     5/2002 Nogawa
(Continued)

FOREIGN PATENT DOCUMENTS

JP     07-074219 A     3/1995
JP     11-251379 A     9/1999
(Continued)

OTHER PUBLICATIONS

Translation of WO 2012026036 A1, Kiyokawa Toshiyuki, Mar. 2012, JP (Foreign Reference provided by applicant).*
(Continued)

*Primary Examiner* — Patrick Assouad
*Assistant Examiner* — Christopher Yodichkas
(74) *Attorney, Agent, or Firm* — Pearne & Gordon LLP

(57) ABSTRACT

A device of contacting a substrate with a probe card includes a mounting table 15 that transfers a wafer W together with a wafer plate 24 to a position facing the probe card 19; a lifting device 15a that contacts multiple electrodes of semiconductor devices formed on the wafer W with multiple probes of the probe card 19 by moving the wafer plate 24 and the wafer W toward the probe card 19 and then further moves the wafer W toward the probe card 19; a depressurization path 26 that decompresses a space S between the probe card 19 and the wafer plate 24 and maintains a contact state between the electrodes of the semiconductor devices and probes 19b of the probe card 19; and the lifting device 15a that separates a chuck member 14 on the mounting table 15 from the wafer plate 24.

9 Claims, 8 Drawing Sheets

(58) Field of Classification Search
USPC .................................... 324/757.04, 756.03
See application file for complete search history.

(56) References Cited

U.S. PATENT DOCUMENTS

| | | | |
|---|---|---|---|
| 2009/0284277 A1 | 11/2009 | Yamada | |
| 2010/0149513 A1* | 6/2010 | Watson | G03F 7/70258 355/72 |
| 2014/0266273 A1* | 9/2014 | Wang | G01R 1/07364 324/750.24 |

FOREIGN PATENT DOCUMENTS

| | | |
|---|---|---|
| JP | 2002-158154 A | 5/2002 |
| JP | 2003-022959 A | 1/2003 |
| JP | 2004-140241 A | 5/2004 |
| JP | 2009-276215 A | 11/2009 |
| JP | 2009-295686 A | 12/2009 |
| JP | 2011-091262 A | 5/2011 |
| WO | 2012/026036 A1 | 3/2012 |

OTHER PUBLICATIONS

International Search Report for PCT/JP2013/067159 dated Jul. 16, 2013.

\* cited by examiner

DEVICE OF CONTACTING SUBSTRATE WITH PROBE CARD AND SUBSTRATE INSPECTION APPARATUS HAVING SAME

CROSS-REFERENCE TO RELATED APPLICATION

This Application is a U.S. national phase application under 35 U.S.C. § 371 of PCT Application No. PCT/JP2013/067159 filed on Jun. 18, 2013, which claims the benefit of Japanese Patent Application No. 2012-169512 filed on Jul. 31, 2012, the entire disclosures of which are incorporated herein by reference.

TECHNICAL FIELD

The embodiments described herein pertain generally to a device of contacting a substrate with a probe card that allows, for example, multiple electrodes of semiconductor devices formed on the substrate, e.g., a wafer to be respectively contacted with multiple probes provided on a probe card of a substrate inspection apparatus, and a substrate inspection apparatus having the device of contacting the substrate with the probe card.

BACKGROUND

As a substrate inspection apparatus, there has been known a probe apparatus or a burn-in inspection apparatus that performs an electrical characteristic inspection with respect to multiple semiconductor devices formed on a wafer.

FIG. 9 is a cross-sectional view illustrating a schematic configuration of a conventional probe apparatus.

A probe apparatus 100 includes a loader chamber 111 that transfers a wafer W; an inspection chamber 112 which is provided to be adjacent to the loader chamber 111 and performs an electrical characteristic inspection with respect to a semiconductor device formed on the wafer W; and a controller 113 provided at an upper portion of the loader chamber 111. Various devices within the loader chamber 111 and the inspection chamber 112 are controlled by the controller 113 to perform the electrical characteristic inspection with respect to the semiconductor device.

The inspection chamber 112 includes a chuck member 114 that receives the wafer W loaded into the inspection chamber 112 through the loader chamber 111; a mounting table 115 that mounts the chuck member 114 together with the wafer W thereon and moves in X-, Y-, Z-, and θ-directions; a wafer inspection interface 116 that is arranged at a ceiling portion of the inspection chamber 112 and has a head plate 117, a pogo frame 118 constituting a lower surface of the head plate 117, and a probe card 119 supported on a lower surface of the pogo frame 118; and an alignment device 120 that adjusts relative positions between multiple probes (inspection needles) 119b provided on the probe card 119 and electrodes of multiple semiconductor devices formed on the wafer W in cooperation with the mounting table 115.

The alignment device 120 includes an upper imaging unit 121 that moves along a ceiling portion of the inspection chamber 112; and a lower imaging unit 122 that is fixed to the chuck member 114.

A relative position between the wafer W and the probe card 119 is adjusted by the mounting table 115 and the alignment device 120 including the upper imaging unit 121 and the lower imaging unit 122. Then, a lifting device (not shown) of the mounting table 115 is extended to move the chuck member 114 upwardly in FIG. 9, so that the electrodes of the wafer W mounted on the chuck member 114 are respectively brought into contact with the probes 119b of the probe card 119. In this state, the electrical characteristic inspection is performed on the multiple semiconductor devices formed on the wafer W (see, for example, Patent Document 1).

Patent Document 1: Japanese Patent Laid-open Publication No. 2004-140241

DISCLOSURE OF THE INVENTION

Problems to be Solved by the Invention

However, according to a technology of contacting a probe card with a wafer in a conventional substrate inspection apparatus, after a relative position between the wafer W and the probe card 119 is adjusted, the chuck member 114 mounting the wafer W thereon is moved by the mounting table 115 to be right under the probe card 119 in the wafer inspection interface 116, and then, the lifting device of the mounting table 115 is extended to move the wafer W together with the chuck member 114 in the upward direction. As a result, the electrodes of the semiconductor devices formed on the wafer W are respectively brought into contact with the probes 119b provided on the probe card 119. Here, electrical contact resistances at respective contact portions between the electrodes of the semiconductor devices and the probes 119b of the probe card 119 are likely to be non-uniform. Therefore, there is a problem that electrical characteristics of the semiconductor devices cannot be properly inspected.

To solve the problems, the example embodiments provide a device of contacting a substrate with a probe card provided in a substrate inspection apparatus that performs an electrical characteristic inspection on semiconductor devices formed on the substrate, and a substrate inspection apparatus having the device of contacting the substrate with the probe card.

Means for Solving the Problems

In accordance with one example embodiment, a device of contacting a substrate with a probe card of a substrate inspection interface in a substrate inspection apparatus including an inspection unit that performs electrical characteristic inspection on semiconductor devices formed on the substrate and the substrate inspection interface provided at an upper portion of the inspection unit includes a transferring device configured to transfer the substrate together with a plate-shaped member to a position facing the probe card; a contacting device configured to move the substrate transferred by the transferring device together with the plate-shaped member toward the probe card to bring multiple electrodes of the semiconductor devices formed on the substrate into contact with multiple probes provided on the probe card, respectively and configured to further move the substrate together with the plate-shaped member by a preset amount toward the probe card; a holding device configured to hold a contact state between the multiple electrodes of the semiconductor devices and the multiple probes of the probe card by depressurizing a space between the probe card and the plate-shaped member; and a separating device configured to separate the transferring device from the plate-shaped member after the contact sate is held by the holding device.

Further, the preset amount may have a range from 10 µm to 150 µm.

Furthermore, the holding device may depressurize the space between the probe card and the plate-shaped member to a pressure at which a contact force, that endures a sum of weights of the substrate and the plate-shaped member at a contact portion between the probe card and the substrate and contact reaction forces between the multiple electrodes of the semiconductor devices and the multiple probes of the probe card, is applied.

Moreover, the holding device may gradually reduce the pressure within the space in stages.

Besides, a sealing member configured to seal the space between the plate-shaped member and the probe card may be provided along a periphery of the plate-shaped member.

Further, the device may further include a depressurization device configured to increase contact pressures between the multiple electrodes of the semiconductor devices and the multiple probes of the probe card by further depressurizing the space after the separating device separates the transferring device from the plate-shaped member.

Furthermore, the device may further include a distance detecting sensor configured to detect a distance between a reference surface of the plate-shaped member and a mounting surface of the probe card or a lower surface of the probe card.

Moreover, the plate-shaped member may be a wafer plate supported on a chuck member.

Besides, the plate-shaped member may be a chuck member mounted on the transferring device.

In accordance with another embodiment, a substrate inspection apparatus may include the device of contacting the substrate with the probe card as described above.

Effect of the Invention

In accordance with the example embodiments, since the substrate transferred to the transferring device is moved together with the plate-shaped member by the contacting device toward the probe card arranged at the upper portion of the inspection chamber, the multiple electrodes of the semiconductor devices formed on the substrate are respectively brought into contact with the multiple probes provided on the probe card. Then, the substrate is further moved together with the plate-shaped member toward the probe card by a preset moving amount. Thereafter, the space between the probe card and the plate-shaped member is decompressed by the holding device to maintain the contact state between the electrodes and the probes. Then, since the transferring device is separated from the plate-shaped member by the separating device, the surface of the substrate in contact with the probe card follows the virtual plane surface formed at the leading ends of the probes of the probe card, so that the electrodes of the semiconductor devices formed on the substrate can be respectively brought into firm contact with the multiple probes of the probe card without non-uniformity in the electrical contact resistance. Therefore, the electrical characteristics of the semiconductor devices on the substrate can be properly inspected.

MODE FOR CARRYING OUT THE INVENTION

Hereinafter, an example embodiment will be explained in detail with reference to the accompanying drawings.

Figure 1:
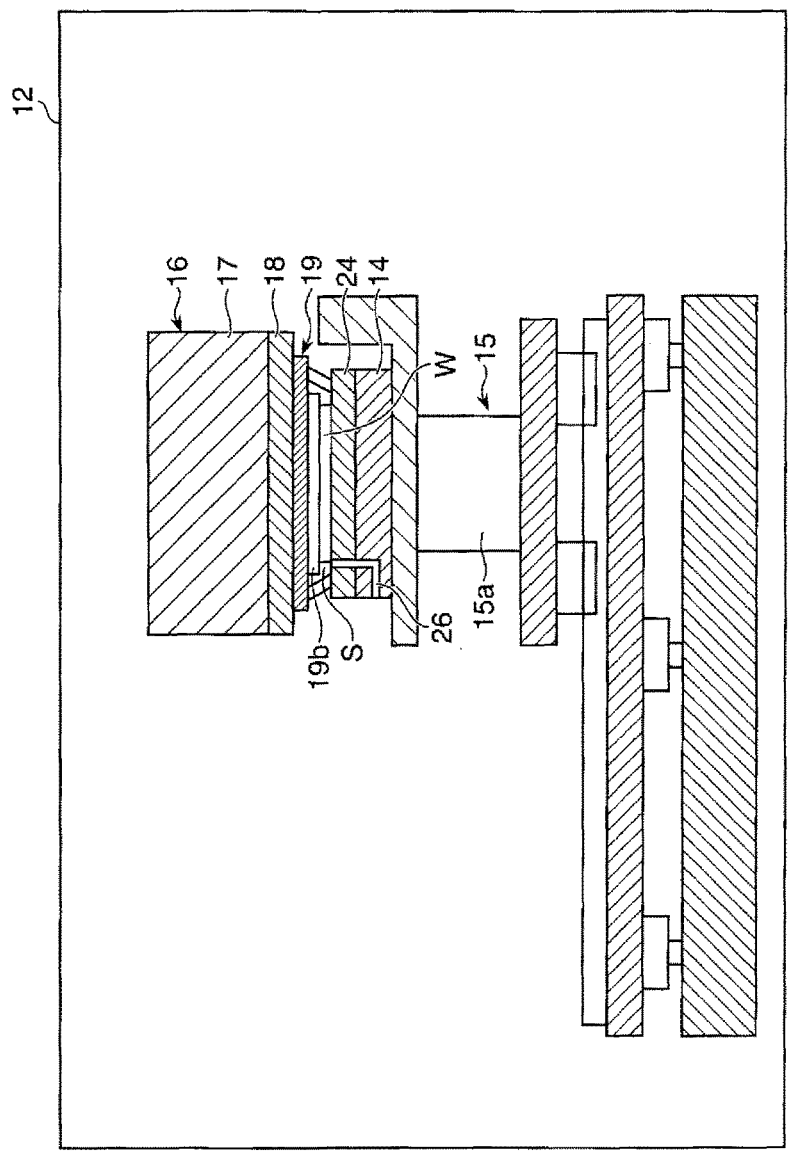
FIG. 1 is a cross-sectional view illustrating a schematic configuration of a device of contacting a substrate to a probe card in accordance with an example embodiment.

FIG. 1 is a cross-sectional view illustrating a schematic configuration of a device of contacting a substrate with a probe card in accordance with an example embodiment.

In FIG. 1, the device of contacting a substrate with a probe card (hereinafter, simply referred to as "substrate contacting device") constitutes a part of a substrate inspection apparatus. In the substrate inspection apparatus including an inspection chamber 12 in which electrical characteristics of semiconductor devices formed on a wafer W as a substrate are inspected and a wafer inspection interface 16 arranged at an upper portion of the inspection chamber 12, the substrate contacting device contacts the wafer W with a probe card 19 supported on the wafer inspection interface 16.

The substrate contacting device of FIG. 1 includes a mounting table 15 serving as a transferring device that transfers the wafer W together with, for example, a wafer plate 24 as a plate-shaped member, to a position facing the probe card 19; a lifting device 15*a* serving as a contacting device that contacts multiple electrodes of the semiconductor devices formed on the wafer W with multiple probes provided on the probe card 19 by moving the wafer plate 24 and the wafer W transferred by the mounting table 15 toward the probe card 19, and then, further moves the wafer W together with the wafer plate 24 by a preset moving amount toward the probe card 19; a depressurization path 26 serving as a holding device that decompresses a space S between the probe card 19 and the wafer plate 24 after the wafer W is further moved by the preset moving amount through the lifting device 15*a*, and holds a contact state between the multiple electrodes of the semiconductor devices and multiple probes 19*b* of the probe card 19; and the lifting device 15*a* serving as a separating device that separates a chuck member 14 on the mounting table 15 from the wafer plate 24 after the contact state is maintained by the depressurization path 26.

The substrate inspection apparatus including the substrate contacting device configured as described above further includes a loader chamber configured to transfer the wafer W into the inspection chamber 12 and a substrate transferring device provided within the loader chamber (all omitted from illustration).

Hereinafter, there will be explained a method of contacting a substrate with a probe card by using the substrate contacting device configured as described above.

FIG. 2 to FIG. 7 are diagrams each illustrating a process of contacting a substrate with a probe card by using the substrate contacting device in accordance with the example embodiment.

Figure 2:
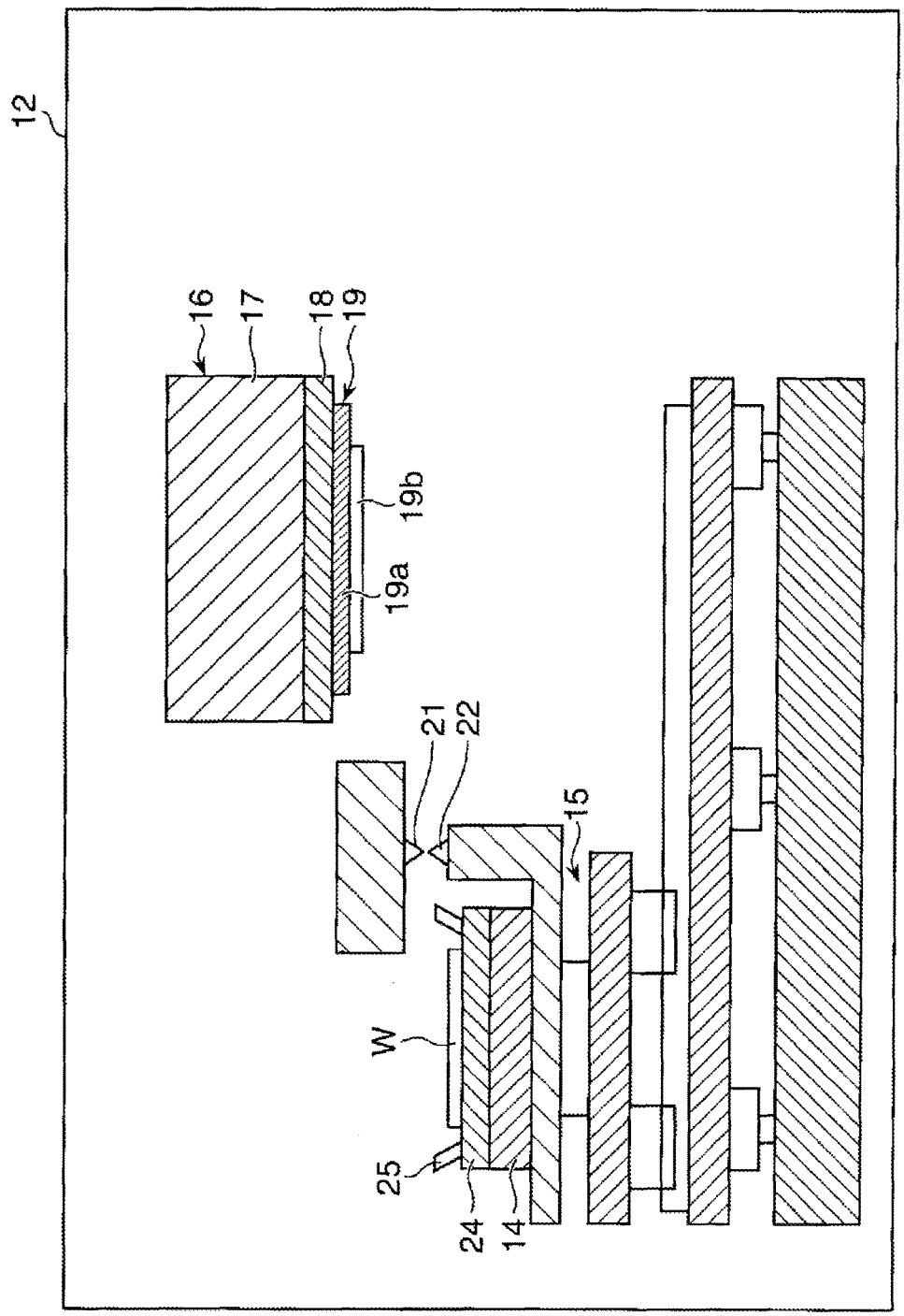
FIG. 2 is a diagram illustrating a process of contacting the substrate to the probe card by using the device of contacting the substrate with the probe card in accordance with the example embodiment.

As shown in FIG. 2, within the inspection chamber 12 of the substrate contacting device in which the method of contacting the substrate with the probe card is performed, a wafer inspection interface 16 is arranged at a ceiling portion thereof. The wafer inspection interface 16 mainly includes a head plate 17; a pogo frame 18 provided at a lower surface of the head plate 17; and a probe card 19 supported on a lower surface of the pogo frame 18. The probe card 19 includes a base member 19a and multiple probes 19b provided at a surface of the substrate 19a facing the wafer W.

The inspection chamber 12 further includes the chuck member 14 configured to mount the wafer W thereon; the wafer plate 24 as a plate-shaped member mounted on the chuck member 14 and configured to receive the wafer W on an upper surface thereof; the mounting table 15 configured to move the chuck member 14, the wafer plate 24, and the wafer W mounted on the wafer plate 24 in X-, Y-, or Z-direction, or rotate them in a θ-direction; an upper imaging unit 21 configured to image positions of the electrodes of the semiconductor devices on the wafer W which is mounted on the chuck member 14 via the wafer plate 24; and a lower imaging unit 22 configured to image positions of the probes 19b on the probe card 19. The upper imaging unit 21 is configured to be moved in the X-direction and the Y-direction by, for example, a guide rail provided in the X-direction along the ceiling portion of the inspection chamber 12 and a horizontal moving unit capable of moving in the Y-direction along the guide rail (all omitted from illustration). Further, the lower imaging unit 22 is fixed to the chuck member 14 and moved in the X-, Y-, or Z-direction or rotated in the θ-direction by the mounting table 15 together with the chuck member 14 within the inspection chamber 12.

In the inspection chamber 12 of the substrate contacting device, if a process of contacting a substrate with a probe card is started, the mounting table 15 that mounts the chuck member 14 thereon is moved to receive and mount a wafer W, which is loaded into the inspection chamber 12 through the loader chamber (see FIG. 1), on an upper surface of the chuck member 14 via the wafer plate 24. Then, while mounting the chuck member 14, the wafer plate 24, and the wafer W in sequence, the mounting table 15 moves to a lower portion of the upper imaging unit 21, and the lower imaging unit 22 fixed to the chuck member 14 is positioned to face the upper imaging unit 21. Then, the focuses of the upper imaging unit 21 and the lower imaging unit 22 are adjusted to be aligned with each other (FIG. 2). In this case, since the focus alignment of the upper imaging unit 21 and the lower imaging unit 22, which is so-called "camera adjustment", is carried out near a central portion (probing center) of the probe card 19, the upper imaging unit 21 is moved to a wafer imaging position adjacent to the wafer inspection interface 16.

Figure 3:
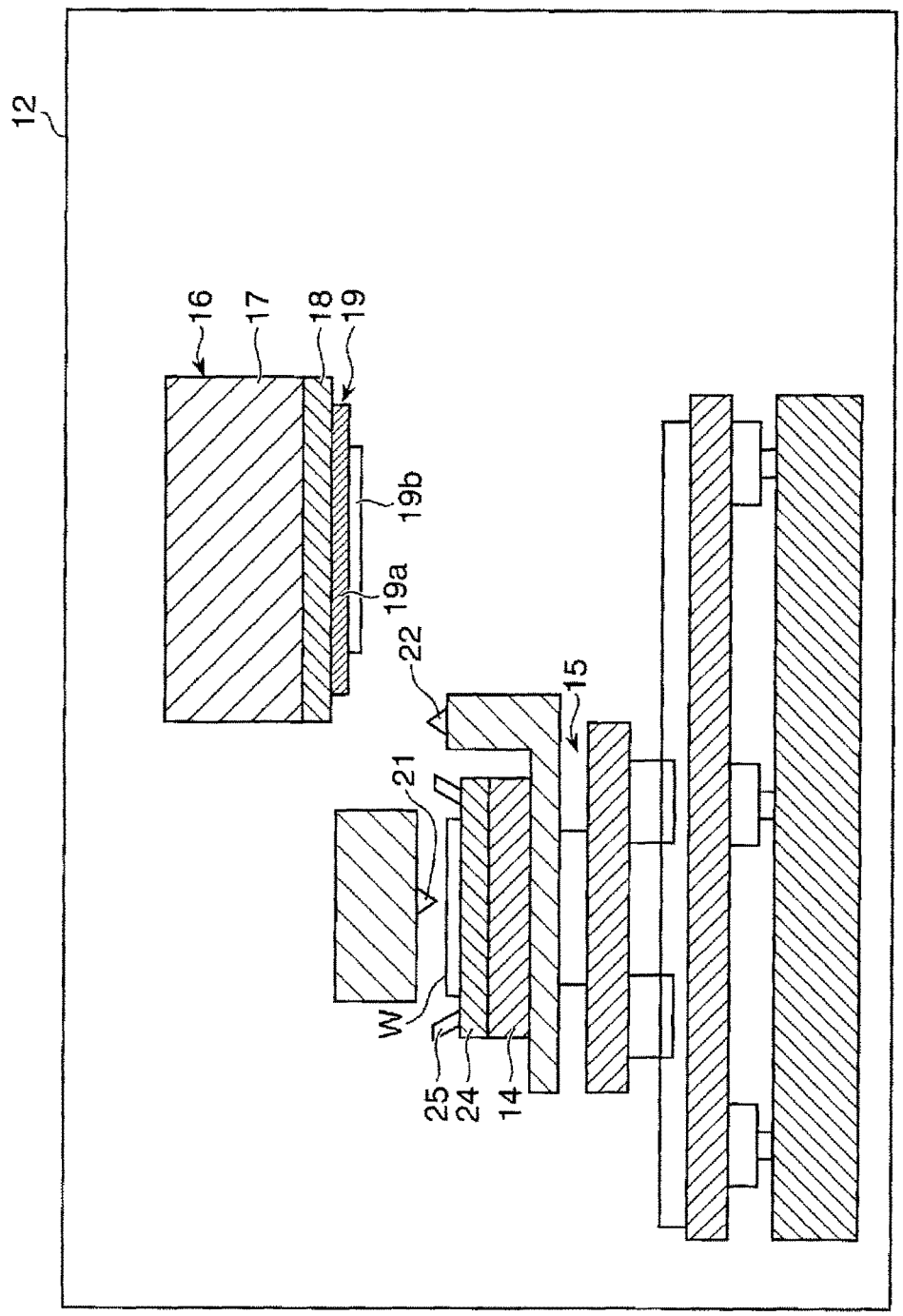
FIG. 3 is a diagram illustrating a process of contacting the substrate to the probe card by using the device of contacting the substrate with the probe card in accordance with the example embodiment.

After aligning the focuses of the upper imaging unit 21 and the lower imaging unit 22 with each other, the upper imaging unit 21 images positions of multiple electrodes of semiconductor devices formed on the wafer W mounted on the chuck member 14 (FIG. 3). In this case, for example, while the upper imaging unit 21 is stopped at the wafer imaging position, the positions of the electrodes of the semiconductor devices formed on the wafer W are imaged. That is, the upper imaging unit 21 is moved to the wafer imaging position and then stopped at the wafer imaging position. In this state, under the upper imaging unit 21, the wafer W mounted on the chuck member 14 is moved by using the mounting table 15 within a range in which the upper imaging unit 21 covers both ends of the wafer W in the X-direction and both ends of the wafer W in the Y-direction (hereinafter, referred to as "first movement range of the wafer W"). Accordingly, the upper imaging unit 21 images each of the positions of the electrodes of all semiconductor devices formed on the wafer W.

Figure 4:
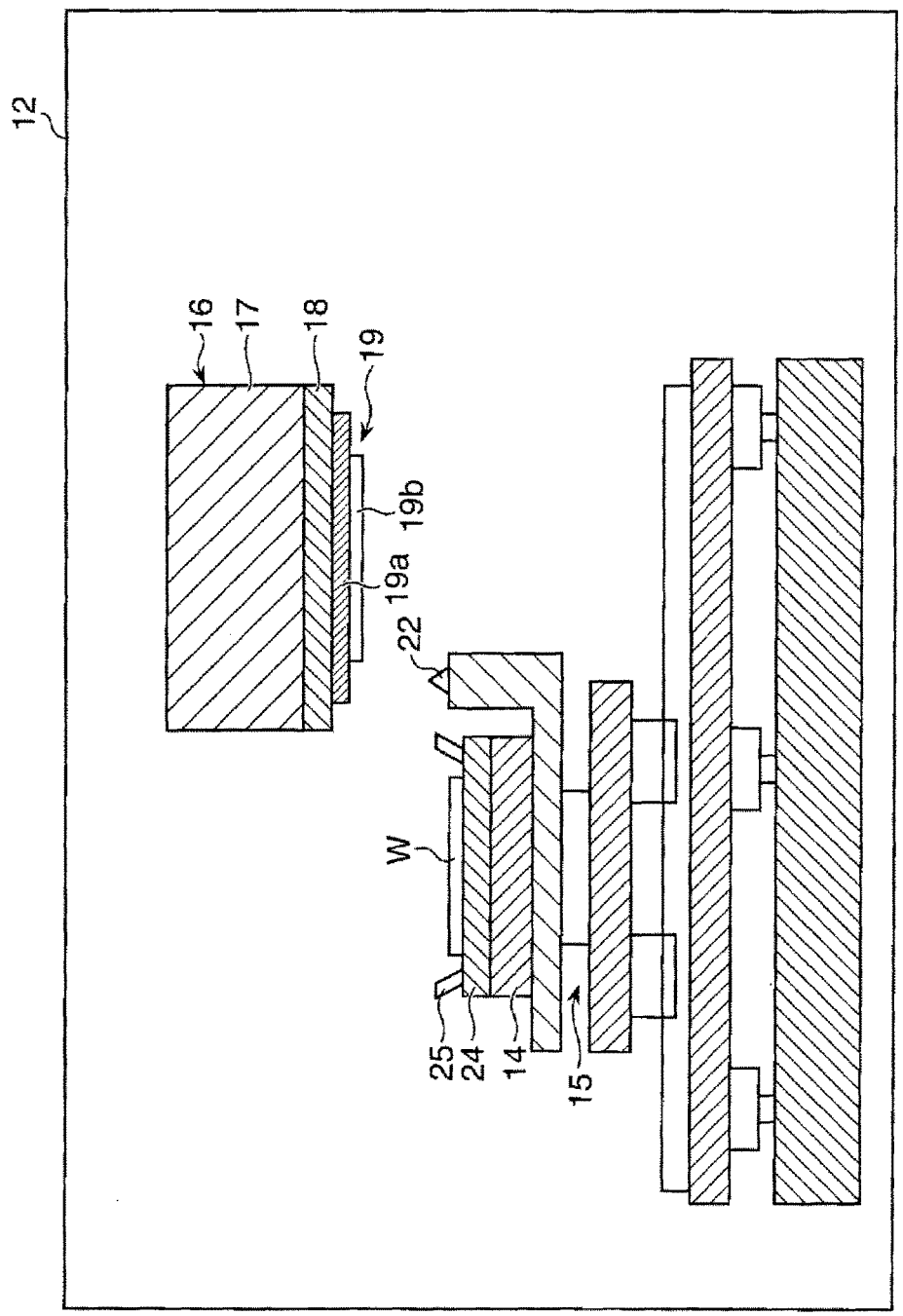
FIG. 4 is a diagram illustrating a process of contacting the substrate to the probe card by using the device of contacting the substrate with the probe card in accordance with the example embodiment.

After imaging the positions of all electrodes of the semiconductor devices formed on the wafer W, the upper imaging unit 21 is retreated to an outside of the first movement range of the wafer W and to an outside of a second movement range of the wafer W to be described later (FIG. 4).

Figure 5:
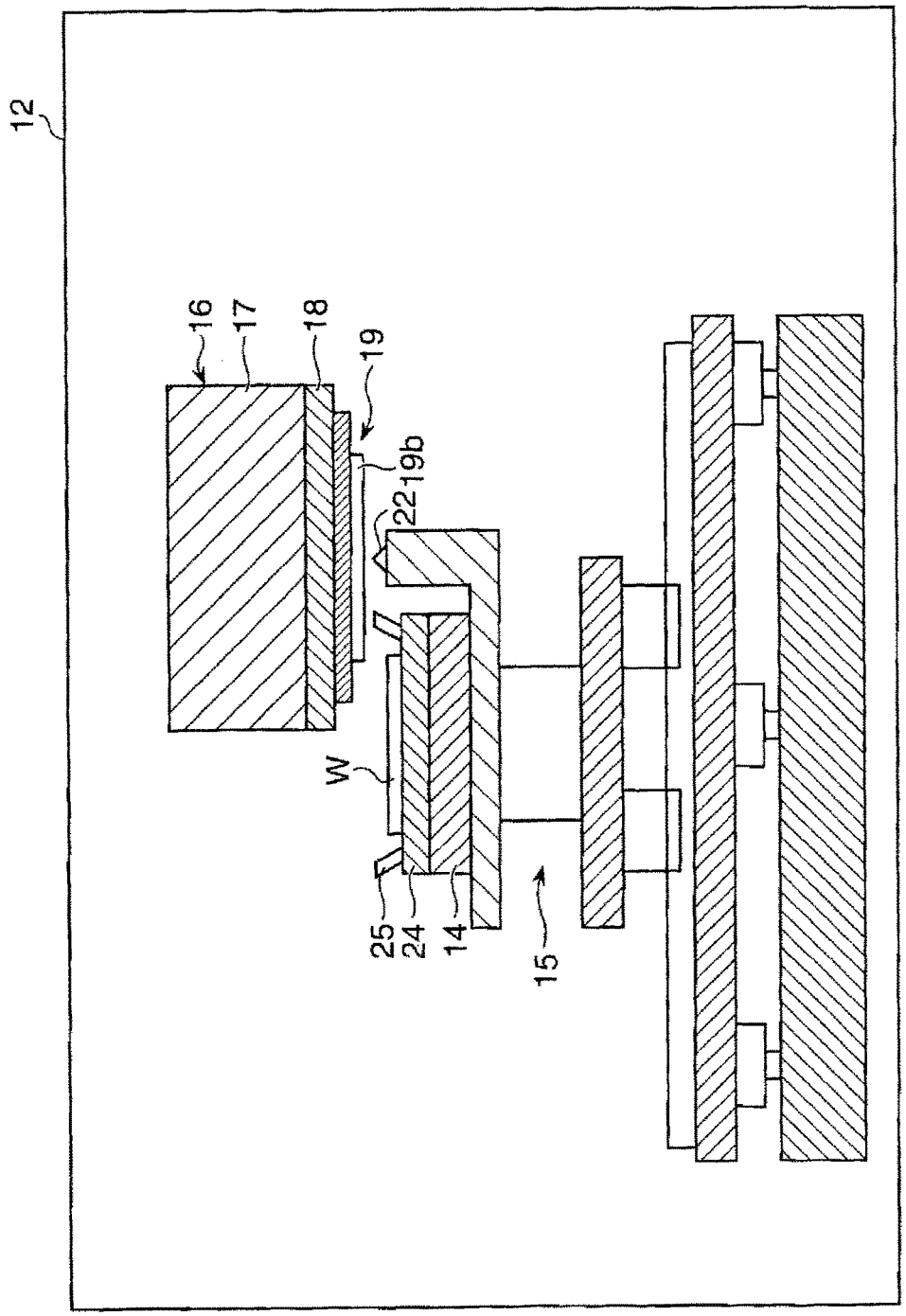
FIG. 5 is a diagram illustrating a process of contacting the substrate to the probe card by using the device of contacting the substrate with the probe card in accordance with the example embodiment.

Then, positions of all the probes 19b provided on the probe card 19 of the wafer inspection interface 16 are imaged by using the lower imaging unit 22 (FIG. 5). All the probes 19b provided on the probe card 19 are imaged by the lower imaging unit 22 which moves under the probe card 19 in the X-direction and the Y-direction. That is, the lower imaging unit 22 needs to image both ends in the X-direction and both ends in the Y-direction passing through the center of the probe card 19, and, thus, the lower imaging unit 22 moves within a range (second movement range of the wafer W) which can covers this imaging range and images positions of all the probes 19b on the probe card 19. Further, the first movement range of the wafer W and the second movement range of the wafer W are mostly overlapped, but may be slightly deviated from each other since the lower imaging unit 22 is provided at a position deviated from the center of the wafer W, i.e., the center of the chuck member 14.

After the positions of the electrodes of the semiconductor devices on the wafer W are imaged by the upper imaging unit 21 and the positions of the probes 19b provided on the probe card 19 are imaged by the lower imaging unit 22 as such, based on the imaging result, a controller (not shown) calculates X-, Y-, and Z-coordinates for contacting each electrode of the semiconductor devices on the wafer W with the corresponding probe 19b. Then, based on the calculation result, the mounting table 15 moves the chuck member 14 in the X-direction or the Y-direction or rotates the chuck member 14 in the θ-direction to transfer the wafer W mounted on the chuck member 14 to be right under the wafer inspection interface 16 such that positions of the electrodes of the semiconductor devices on the wafer W are aligned with the positions of the probes 19b of the probe card 19 (transfer process).

Figure 6:
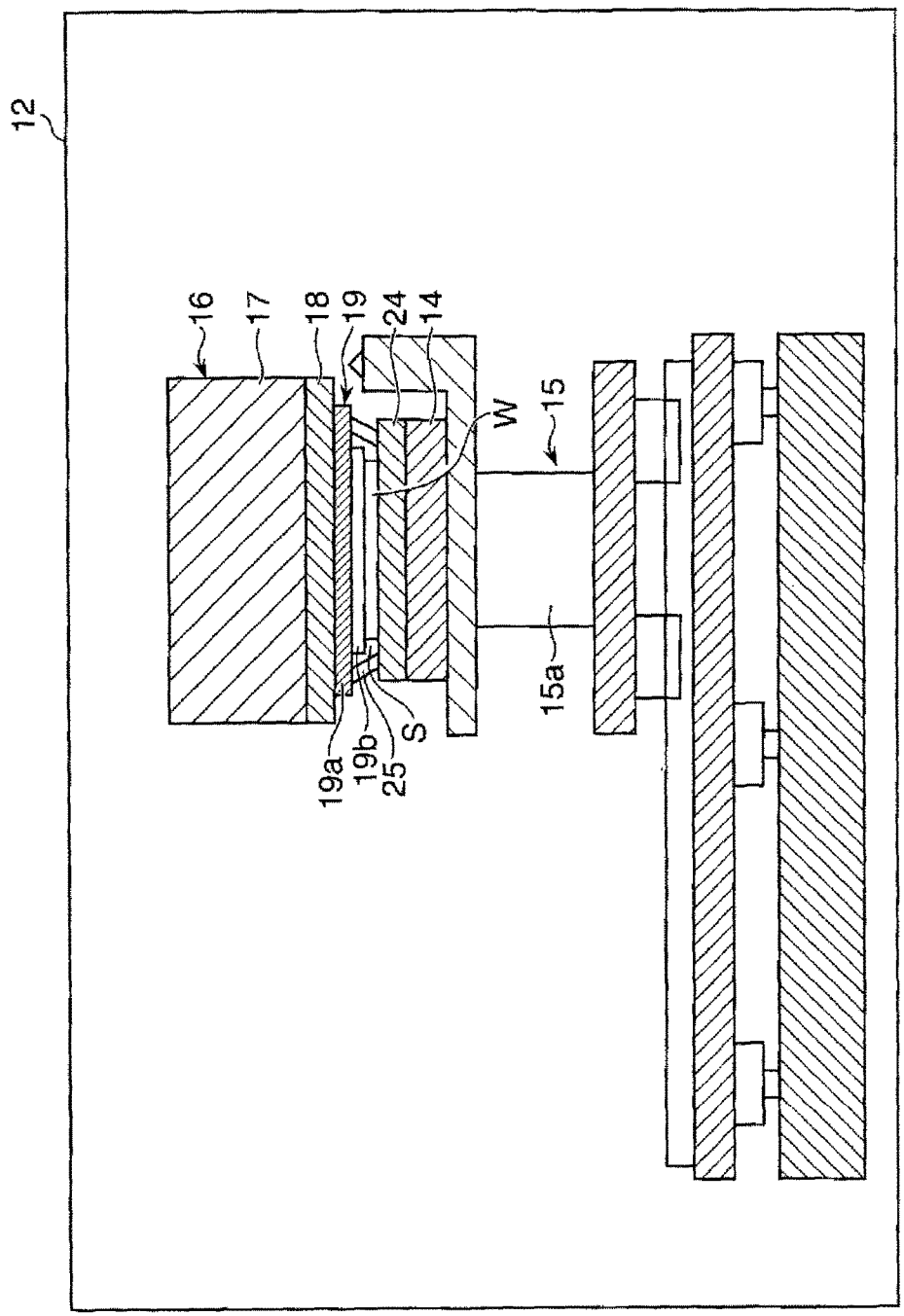
FIG. 6 is a diagram illustrating a process of contacting the substrate to the probe card by using the device of contacting the substrate with the probe card in accordance with the example embodiment.

Then, the mounting table 15 moves the wafer W together with the wafer plate 24 upwardly in the drawing by extending the lifting device 15a provided at the mounting table 15 and brings the multiple electrodes of the semiconductor devices on the wafer W into contact with the multiple probes 19*b* provided on the probe card 19. Then, the mounting table 15 further moves the wafer W together with the wafer plate 24 upwardly by a preset amount toward the probe card 19 to securely bring the multiple electrodes of the semiconductor devices on the wafer W into contact with the multiple probes 19*b* provided on the probe card 19 (contacting process) (FIG. 6). In this case, a moving amount for further moving (hereinafter, referred to as "overdriving") the wafer W by the preset amount toward the probe card 19 is for example, desirably, from 10 µm to 150 µm.

While the multiple electrodes of the semiconductor devices on the wafer W are in contact with the multiple probes 19*b* provided on the probe card 19, an upper end portion of an O-ring 25 as a sealing member provided along the periphery of an upper surface of the wafer plate 24 is in contact with a lower outer periphery of the base member 19*a* of the probe card 19. As a result, a sealed space S is formed between the probe card 19 and the wafer plate 24 facing the probe card 19.

Figure 7:
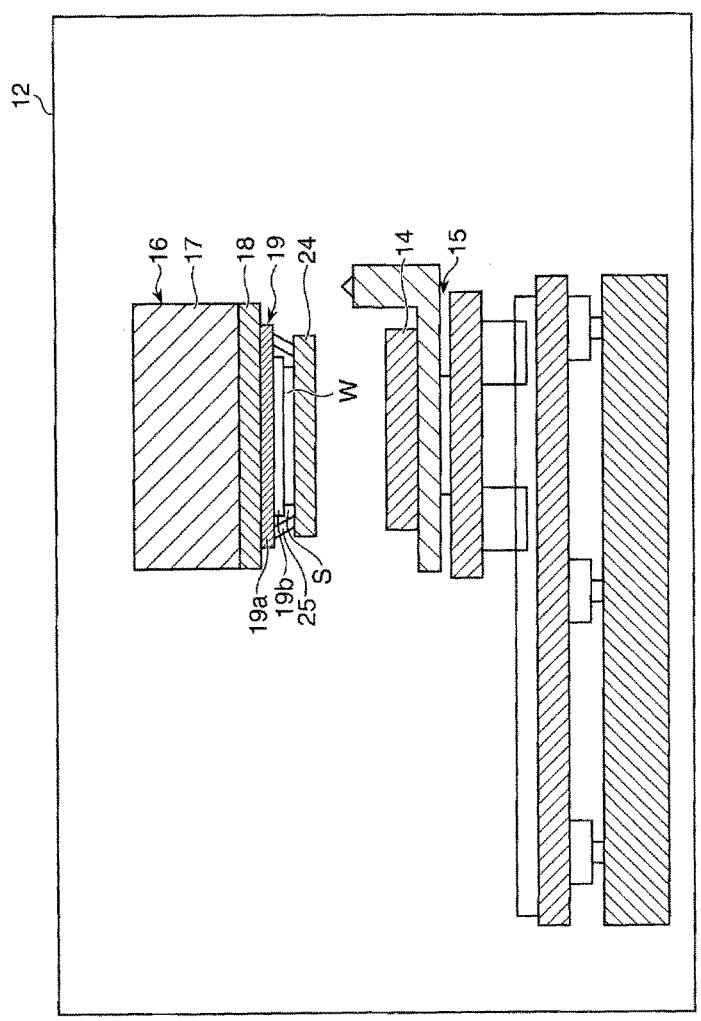
FIG. 7 is a diagram illustrating a process of contacting the substrate to the probe card by using the device of contacting the substrate with the probe card in accordance with the example embodiment.

Subsequently, the space S between the probe card 19 and the wafer plate 24 is depressurized by a holding device (see FIG. 1), which is not shown, to maintain a contact state (holding process). Then, the lifting device of the mounting table 15 is contracted to separate the chuck member 14 from the wafer plate 24, and the chuck member 14 is moved downwards (separating process) (FIG. 7). In this case, a pressure within the space S is adjusted to a pressure, for example, −0.2 kPa to −20 kPa, at which it is possible to obtain a contact force which can endure a sum of the weights of the wafer W and the wafer plate 24 and reaction forces opposing contact forces between the multiple electrodes of the semiconductor devices and the multiple probes of the probe card. Further, the optimum depressurization pressure for the space S may vary depending on processing conditions, for example, the number of the probes 19*b* provided on the probe card 19. Further, the depressurization path 26 serving as the holding device (see FIG. 1) is connected to a pressure controller.

After the wafer W is brought into contact with the probe card 19 of the wafer inspection interface 16 in the inspection chamber 12 as such, an electrical characteristic inspection is performed on the semiconductor devices formed on the wafer W in the inspection chamber 12.

In accordance with the present example embodiment, after the wafer W mounted on the wafer plate 24 is brought into contact with the probe card 19, the wafer W is further overdriven by a preset amount, and then, the space S between the probe card 19 and the wafer plate 24 is decompressed to maintain a contact state between the wafer W and the probe card 19. Therefore, it is possible to reduce the electrical contact resistance by securely bring the multiple electrodes of the semiconductor devices into contact with the multiple probes 19*b* of the probe card 19, and also possible to improve accuracy of the electrical characteristic inspection with respect to the semiconductor device.

Further, in accordance with the present example embodiment, it is possible to reduce non-uniformity in the electrical contact resistance at respective contact portions between the electrodes of the semiconductor devices on the wafer W and the probes 19*b* provided on the probe card 19.

This can be explained as follows. After the multiple electrodes of the semiconductor devices on the wafer W are brought into contact with the multiple probes 19*b* provided on the probe card 19, the chuck member 14 is separated from the wafer plate 24 as the plate-shaped member. As a result, stiffness of a structure including the wafer W and the wafer plate 24 is reduced and the surface of the wafer W in contact with the probe card 19 can be deformed to follow a virtual plane surface formed at leading ends of the probes 19*b* of the probe card 19. For example, if the probes 19*b* of the probe card 19 are not uniform in length, or even if the probe card 19 is not parallel with the wafer W, the leading ends of the probes 19*b* can be brought into contact with the respective electrodes of the semiconductor devices of the wafer W. Although there has been explained the case where the wafer plate 24 is applied as the plate-shaped member, the plate-shaped member is not limited to the wafer plate 24, and the chuck member 14 may be applied as the plate-shaped member to be brought into contact with the wafer W.

Furthermore, in accordance with the present example embodiment, it is possible to suppress the defective products from being caused by the deviation in the contact positions between the electrodes of the semiconductor devices and the probes 19*b* of the probe card 19.

That is, in the present example embodiment, since the electrodes of the semiconductor devices on the wafer W are brought into contact with the probes 19*b* provided on the probe card 19 in an overdrive state before the space S is depressurized, the contact state between the electrodes and the probes 19*b* is maintained and the contact positions are not deviated. Therefore, it is possible to suppress in advance the defective product from being caused by the deviation of needle positions. However, for example, in a method in which the space S is formed before the electrodes of the semiconductor devices are brought into contact with the probes of the probe card and the space S is depressurized to cause the electrodes to contact the probes, the contact forces of the electrodes with respect to the probes may not be sufficient, so that the contact positions between the electrodes and the probes are likely to be deviated and needle mark size is increased, which may cause the defective product.

Further, in accordance with the present example embodiment, the upper imaging unit 21 is configured to be retreated to the outside of the first movement range of the wafer W and to the outside of the second movement range of the wafer W, so that the upper imaging unit 21 does not interfere with the movement of the chuck member 14 that mounts the wafer W thereon.

In the present example embodiment, it is desirable to gradually reduce the pressure within the space S in stages. Thus, it is possible to suppress excessive depressurization of the space Sand to suppress deterioration in product quality caused by the increase of the needle marks. As a method of gradually reducing the pressure within the space S in stages, there is a depressurizing method in which for example, if a depressurization pressure at which the space S is depressurized to a final depressurization state in the holding process is 100%, a depressurization amount is regularly and gradually increased by, for example, 20%. Thus, it is possible to depressurize the space S without a bad influence on the contact portions between the electrodes of the semiconductor devices on the wafer W and the probes 19*b* of the probe card 19. Besides the method of regularly and gradually changing the depressurization pressure in stages, there may be a method of irregularly and gradually changing the depressurization pressure.

The substrate contacting device in accordance with the present example embodiment can be applied to a probe apparatus including a single chuck member (substrate transferring device) facing a single wafer inspection interface within a single inspection chamber, and also applied to a substrate inspection apparatus including multiple inspection units, and a substrate transferring device configured to transfer the substrate among the multiple inspection units or between the multiple inspection units and multiple loading/unloading sections.

In the present example embodiment, there may be provided a distance detecting sensor 27 configured to detect a distance from a reference surface, e.g., an upper surface (chuck top) 14a, of the chuck member 14 as the plate-shaped member to a lower surface 18a of the pogo frame 18 as the mounting surface of the probe card 19 or a distance from the chuck top 14a to a lower surface (a virtual surface formed of the leading ends of the probes 19b) of the probe card 19.

That is, the contact state between the electrodes of the semiconductor devices formed on the wafer W and the probes 19b provided on the probe card 19 is maintained by depressurizing the space S between the probe card 19 and the wafer plate 24 in the holding process after the contacting process. In this case, if the pressure within the space S is changed in the holding process, the upper surface of the wafer plate 24 or the chuck top 14a (reference surface) as the upper surface of the chuck member 14 in contact with a lower surface of the wafer plate 24 may be shifted. If the chuck top 14a is shifted, the contact state between the electrodes of the semiconductor devices on the wafer W mounted on the chuck top 14a and the probes 19b provided on the probe card 19, i.e., an overload amount at the contact portions, is changed, so that a stable contact state cannot be maintained.

Therefore, the distance detecting sensor 27 configured to detect a distance L1 from the chuck top 14a to the lower surface 18a of the pogo frame 18 or a distance L2 (hereinafter, simply referred to as "the height of the chuck top 14a") from the chuck top 14a to the lower surface of the probe card 19 is provided and the space S is depressurized in the holding process while the detection data of the distance detecting sensor 27 are fed back. Thus, it is possible to avoid the shift of the chuck top 14a caused by the pressure change within the space S, and also possible to avoid the change in the overload amount at the respective contact portions between the electrodes of the semiconductor devices formed on the wafer W and the probes 19b provided on the probe card 19.

Figure 8:
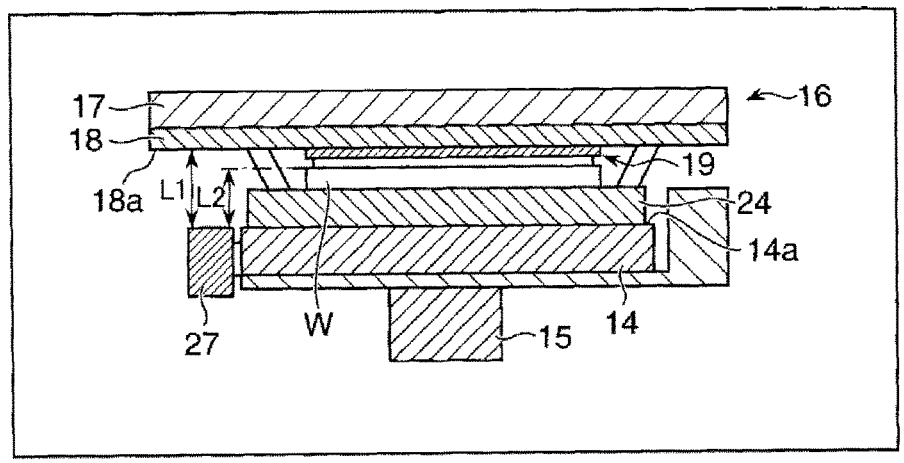
FIG. 8 is a cross-sectional view illustrating a modification example of the device of contacting the substrate with the probe card in accordance with the example embodiment.
Figure 9:
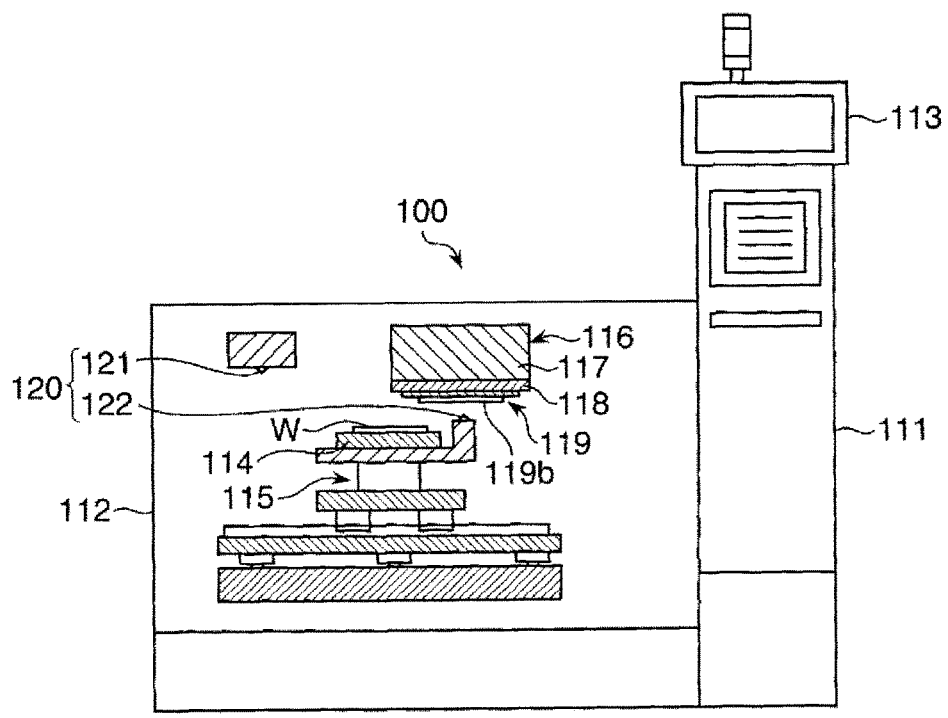
FIG. 9 is a cross-sectional view illustrating a schematic configuration of a conventional probe apparatus.

FIG. 8 is a cross-sectional view illustrating a modification example of the device of contacting the substrate with the probe card in accordance with the example embodiment.

As shown in FIG. 8, the distance detecting sensor 27 configured to detect the height of the chuck top 14a is provided at an end of the chuck member 14.

Within the inspection chamber 12 configured as described above, in the holding process after the contacting process in which the multiple electrodes of the semiconductor devices formed on the wafer W are brought into contact with the multiple probes 19b provided on the probe card 19 and then the wafer W is moved upwardly by a preset amount to contact the multiple electrodes of the semiconductor devices formed on the wafer W with the multiple probes 19b provided on the probe card 19 with a preset overdriving amount, the space S is depressurized while data about the height of the chuck top 14a detected by the distance detecting sensor 27 are fed back.

In this case, for example, if a pressure change within the space S is caused by a change in ambient temperature of the substrate inspection apparatus, leakage of the space S, etc., the height of the chuck top 14a may be shifted, so that a preset overdriving amount cannot be maintained. In the modification example of the present example embodiment, the height of the chuck top 14a is detected by the distance detecting sensor 27, and the space S is depressurized while the data about the detected height of the chuck top 14a are fed back to the pressure controller connected to the depressurization path 26 (see FIG. 1). As a result, it is possible to avoid the shift of the chuck top 14a and also possible to avoid the change in the overdriving amount. Therefore, it is possible to maintain a required contact state. Thus, even when the pressure within the space S is likely to be changed caused by the change in the ambient temperature, by suppressing the pressure change, a preset overdriving amount at the respective contact portions between the electrodes of the semiconductor devices and the probes 19b of the probe card 19 can be properly maintained. Accordingly, it is possible to further improve accuracy of the electrical characteristic inspection with respect to the semiconductor devices.

In the present example embodiment, after the wafer plate 24 is separated from the chuck member 14, the contact pressure between the multiple electrodes of the semiconductor devices on the wafer W and the multiple probes 19b of the probe card 19 can be further increased by further depressurizing the space S. Thus, by securely bringing the multiple electrodes of the semiconductor devices into contact with the multiple probes 19b of the probe card 19, it is possible to further reduce the electrical contact resistance at the contact portions.

Although the present disclosure has been explained with reference to the example embodiment, the present disclosure is not limited to the above-described example embodiment.

This patent application claims the benefit of priority to Japanese Patent Application No. 2012-169512 filed on Jul. 31, 2012 and incorporated herein by reference in its entirety.

EXPLANATION OF REFERENCE NUMERALS

W: Wafer
S: Space
12: Inspection chamber
14: Chuck member
15: Mounting table
16: Wafer inspection interface
17: Head plate
18: Pogo frame
19: Probe card
19b: Probe
21: Upper imaging unit
22: Lower imaging unit
24: Wafer plate
25: O-ring
26: Depressurization path
27: Distance detecting sensor

I claim:

1. A device of contacting a substrate with a probe card of a substrate inspection interface provided in a substrate inspection apparatus including an inspection unit that performs electrical characteristic inspection on semiconductor devices formed on the substrate and the substrate inspection interface provided at an upper portion of the inspection unit, the device comprising:
a transferring device configured to transfer the substrate together with a plate-shaped member to a position facing the probe card;
a contacting device configured to move the substrate transferred by the transferring device together with the plate-shaped member toward the probe card to bring multiple electrodes of the semiconductor devices formed on the substrate into contact with multiple probes provided on the probe card, respectively and configured to further move the substrate together with the plate-shaped member by a preset amount toward the probe card;

a holding device configured to hold a contact state between the multiple electrodes of the semiconductor devices and the multiple probes of the probe card by depressurizing a space between the probe card and the plate-shaped member such that the space between the probe card and the plate-shaped member is started to be depressurized after the substrate has been brought into contact with the probe card and the substrate has been further moved with the plate-shaped member by the preset amount toward the probe card;

a separating device configured to separate the transferring device from the plate-shaped member after the contact sate is held by the holding device; and a distance detecting sensor configured to detect a distance between a reference surface of the plate-shaped member and a mounting surface of the probe card or a lower surface of the probe card, wherein the holding device is configured to depressurize the space between the probe card and the plate-shaped member based on the distance between the reference surface of the plate-shaped member and the mounting surface of the probe card or the lower surface of the probe card.

2. The device of claim 1,
wherein the preset amount has a range from 10 μm to 150 μm.

3. The device of claim 1,
wherein the holding device depressurizes the space between the probe card and the plate-shaped member to a pressure at which a contact force, that endures a sum of weights of the substrate and the plate-shaped member at a contact portion between the probe card and the substrate and contact reaction forces between the multiple electrodes of the semiconductor devices and the multiple probes of the probe card, is applied.

4. The device of claim 3,
wherein the holding device gradually reduces the pressure within the space in stages.

5. The device of claim 1,
wherein a sealing member configured to seal the space between the plate-shaped member and the probe card is provided along a periphery of the plate-shaped member.

6. The device of claim 1, further comprising:
a depressurization device configured to increase contact pressures between the multiple electrodes of the semiconductor devices and the multiple probes of the probe card by further depressurizing the space after the separating device separates the transferring device from the plate-shaped member.

7. The device of claim 1,
wherein the plate-shaped member is a wafer plate supported on a chuck member.

8. The device of claim 1,
wherein the plate-shaped member is a chuck member mounted on the transferring device.

9. A substrate inspection apparatus comprising a device of contacting a substrate with a probe card as claimed in claim 1.

* * * * *